United States Patent
Chen et al.

(10) Patent No.: US 11,031,381 B2
(45) Date of Patent: *Jun. 8, 2021

(54) OPTICAL TRANSCEIVER AND MANUFACTURING METHOD THEREOF

(71) Applicant: Taiwan Semiconductor Manufacturing Co., Ltd., Hsinchu (TW)

(72) Inventors: Chih-Hao Chen, Hsinchu (TW); Chin-Fu Kao, Taipei (TW); Li-Hui Cheng, New Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,858

(22) Filed: Nov. 22, 2018

(65) Prior Publication Data

US 2020/0135707 A1    Apr. 30, 2020

Related U.S. Application Data

(60) Provisional application No. 62/752,371, filed on Oct. 30, 2018.

(51) Int. Cl.
*H01L 25/18* (2006.01)
*G02B 6/12* (2006.01)
(Continued)

(52) U.S. Cl.
CPC ............... *H01L 25/18* (2013.01); *G02B 6/12* (2013.01); *H01L 23/3107* (2013.01);
(Continued)

(58) Field of Classification Search
CPC ..... H01L 23/3107; H01L 24/10; H01L 25/50; H01L 25/18; G02B 6/12
See application file for complete search history.

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| CN | 103312415 | 9/2013 |
| CN | 104766903 | 7/2015 |

(Continued)

OTHER PUBLICATIONS

"Office Action of Taiwan Counterpart Application", dated Jun. 12, 2019, p. 1-p. 6.

(Continued)

*Primary Examiner* — Thomas A Hollweg
*Assistant Examiner* — Mary A El-Shammaa
(74) *Attorney, Agent, or Firm* — JCIPRNET

(57) ABSTRACT

An optical transceiver including a photonic integrated circuit component, an electric integrated circuit component and an insulating encapsulant is provided. The photonic integrated circuit component includes at least one optical input/output portion and at least one groove located in proximity of the at least one optical input/output portion. The electric integrated circuit component is disposed on and electrically connected to the photonic integrated circuit component.
The insulating encapsulant is disposed on the photonic integrated circuit component and laterally encapsulating the electric integrated circuit component. The at least one groove of the photonic integrated circuit component is revealed by the insulating encapsulant and is adapted for insertion of a photonic device.

20 Claims, 17 Drawing Sheets

(51) Int. Cl.
*H01L 23/31* (2006.01)
*H01L 25/00* (2006.01)
*H01L 23/00* (2006.01)

(52) U.S. Cl.
CPC .............. *H01L 24/10* (2013.01); *H01L 25/50* (2013.01); *G02B 2006/12197* (2013.01); *H01L 2924/14* (2013.01)

(56) References Cited

U.S. PATENT DOCUMENTS

| | | | |
|---|---|---|---|
| 9,299,649 | B2 | 3/2016 | Chiu et al. |
| 9,362,444 | B1* | 6/2016 | Leobandung ......... H01L 31/184 |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,703,056 | B2 | 7/2017 | Neelakantan et al. |
| 9,735,131 | B2 | 8/2017 | Su et al. |
| 10,333,623 | B1* | 6/2019 | Liao ....................... H01L 25/167 |
| 2015/0222364 | A1* | 8/2015 | Hwang .................. H01L 23/00 398/138 |
| 2015/0331187 | A1* | 11/2015 | Lee ........................ G02B 6/136 438/24 |
| 2017/0047312 | A1* | 2/2017 | Budd .................... G02B 6/4204 |
| 2017/0288780 | A1 | 10/2017 | Yim et al. |
| 2018/0203187 | A1 | 7/2018 | Doerr et al. |
| 2019/0067260 | A1* | 2/2019 | Koyama ........... H01L 23/49827 |
| 2019/0131267 | A1* | 5/2019 | Wang ..................... H01L 21/304 |
| 2019/0369333 | A1* | 12/2019 | Testa ....................... G02B 6/305 |
| 2020/0003975 | A1* | 1/2020 | Yu ............................ H01L 24/94 |
| 2020/0064660 | A1* | 2/2020 | Langford ............ H01L 23/5387 |

FOREIGN PATENT DOCUMENTS

| | | |
|---|---|---|
| CN | 107111086 | 8/2017 |
| TW | 200304186 | 9/2003 |
| TW | 201317652 | 5/2013 |
| TW | 201530205 | 8/2015 |
| TW | 201631626 | 9/2016 |
| TW | 201643488 | 12/2016 |
| TW | 201737412 | 10/2017 |
| TW | 201816946 | 5/2018 |
| WO | 2016070055 | 5/2016 |
| WO | 2017172184 | 10/2017 |
| WO | 2018002675 | 1/2018 |

OTHER PUBLICATIONS

"Office Action of China Counterpart Application", dated Mar. 25, 2021, p. 1-p. 8.

* cited by examiner

OPTICAL TRANSCEIVER AND MANUFACTURING METHOD THEREOF

CROSS-REFERENCE TO RELATED APPLICATION

This application claims the priority benefits of U.S. provisional application Ser. No. 62/752,371, filed on Oct. 30, 2018. The entirety of the above-mentioned patent application is hereby incorporated by reference herein and made a part of this specification.

BACKGROUND

Optical transceiver modules are used in high-speed optical communication systems that require high performance, compact package, and low power consumption. Optical transmission/reception functions are implemented in pluggable optical transceiver modules. The optical transceiver modules comply with various international standard specifications at communication speeds ranging up to more than 100 Gbps. Currently, fabrication process of the optical transceiver modules is quite complex and increase of the yield rate thereof is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
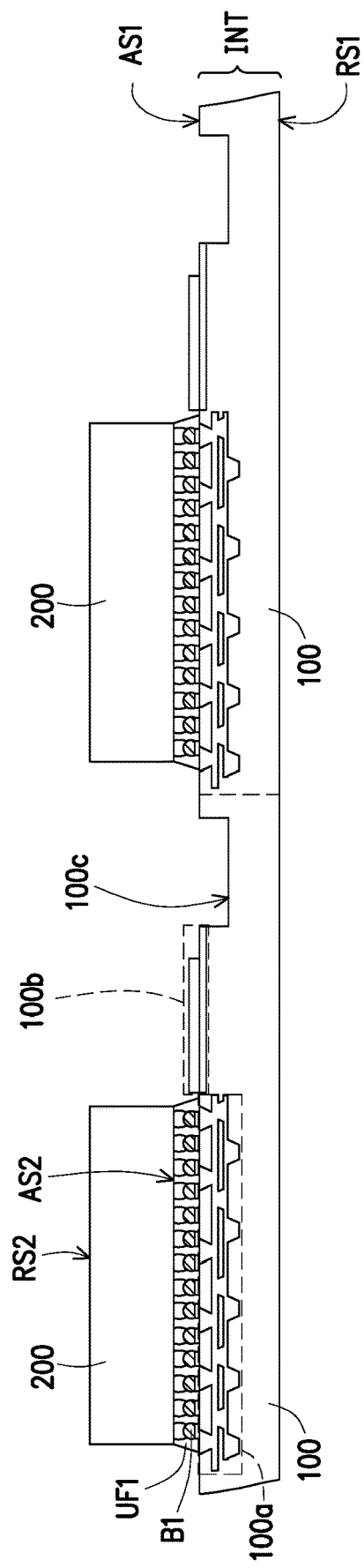
FIGS. 1 through 13 illustrate a process flow for fabricating an optical transceiver in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
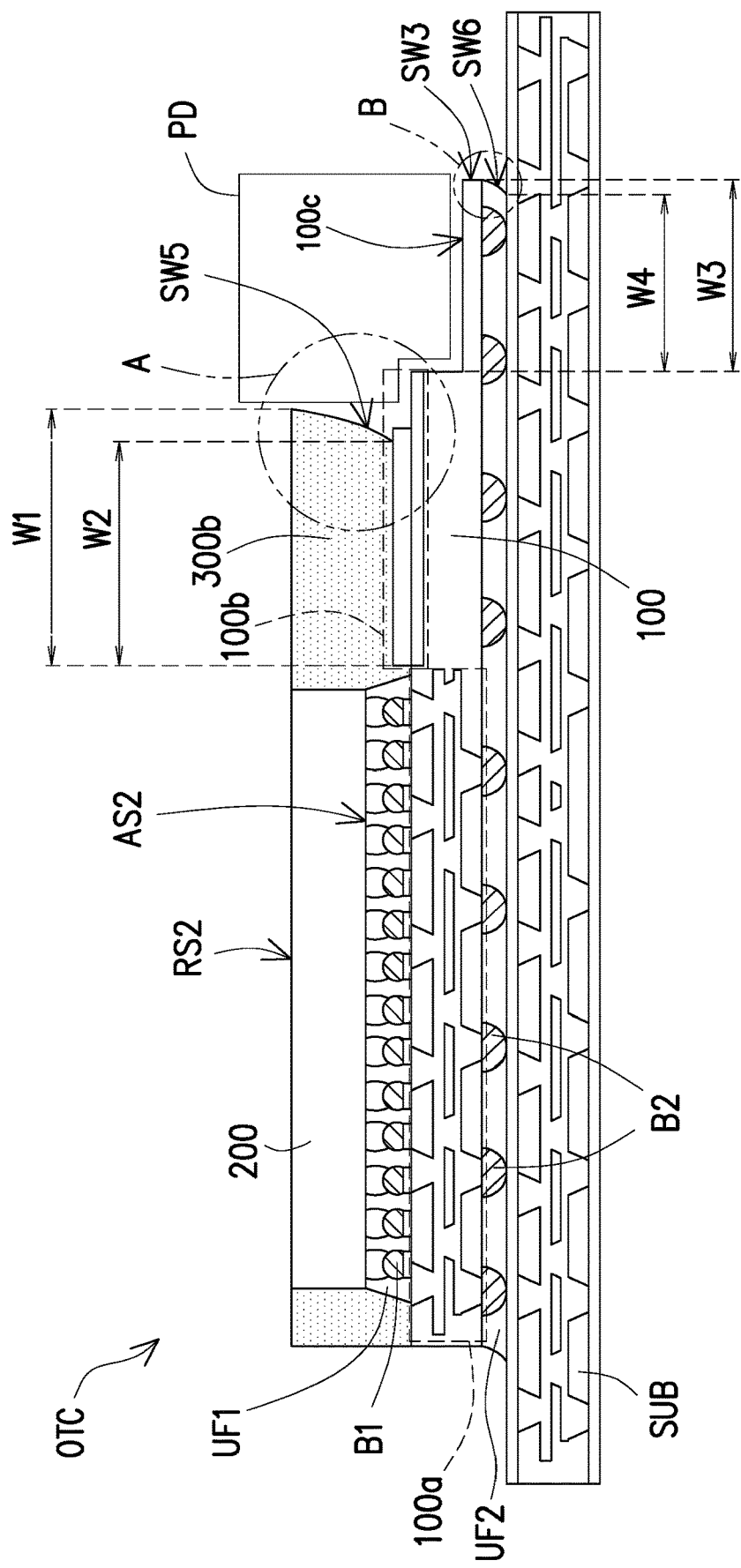
Figure 14A:
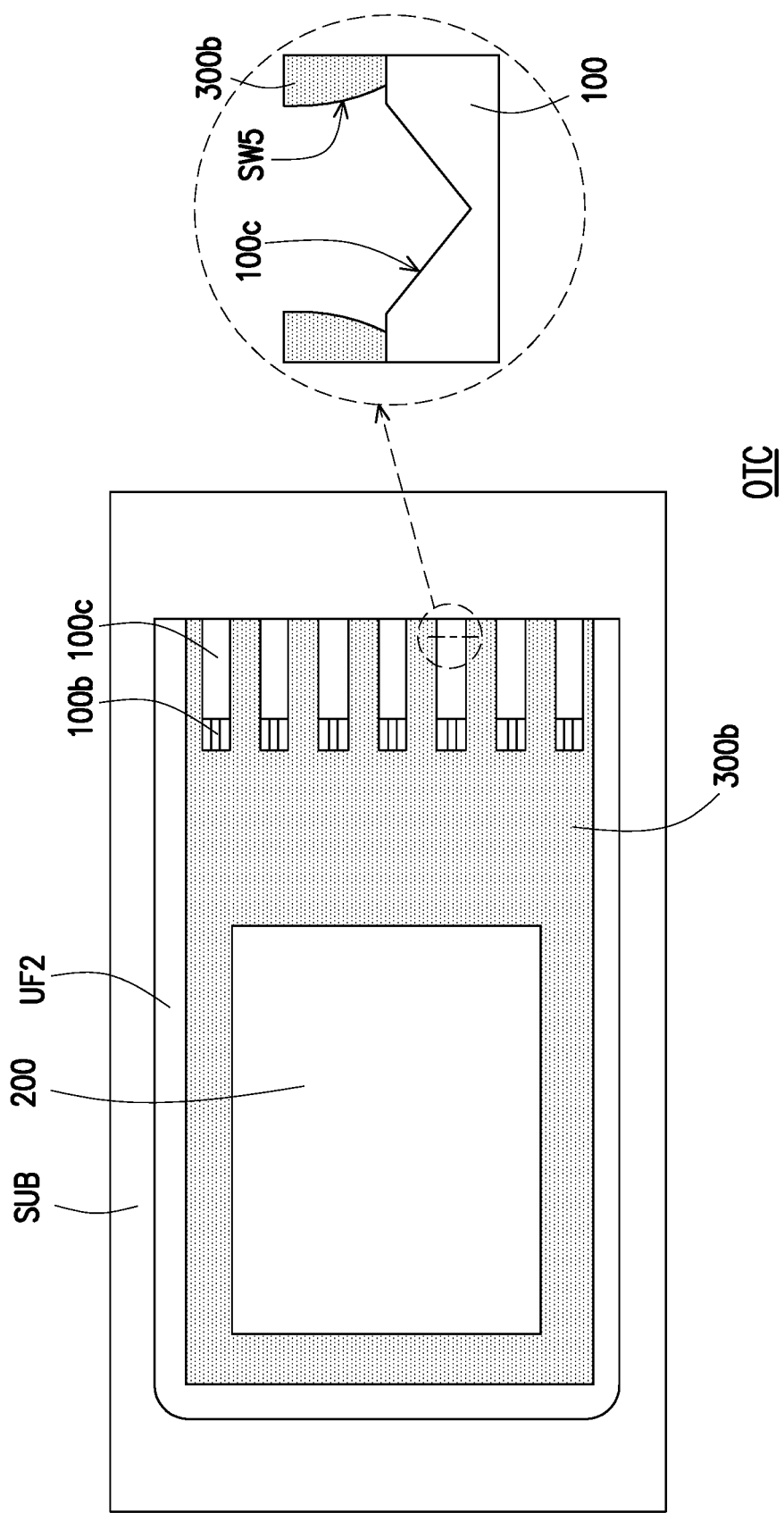
FIG. 14A is a schematic view of the optical transceiver illustrated in FIG. 13 in accordance with some embodiments of the present disclosure.
Figure 14B:
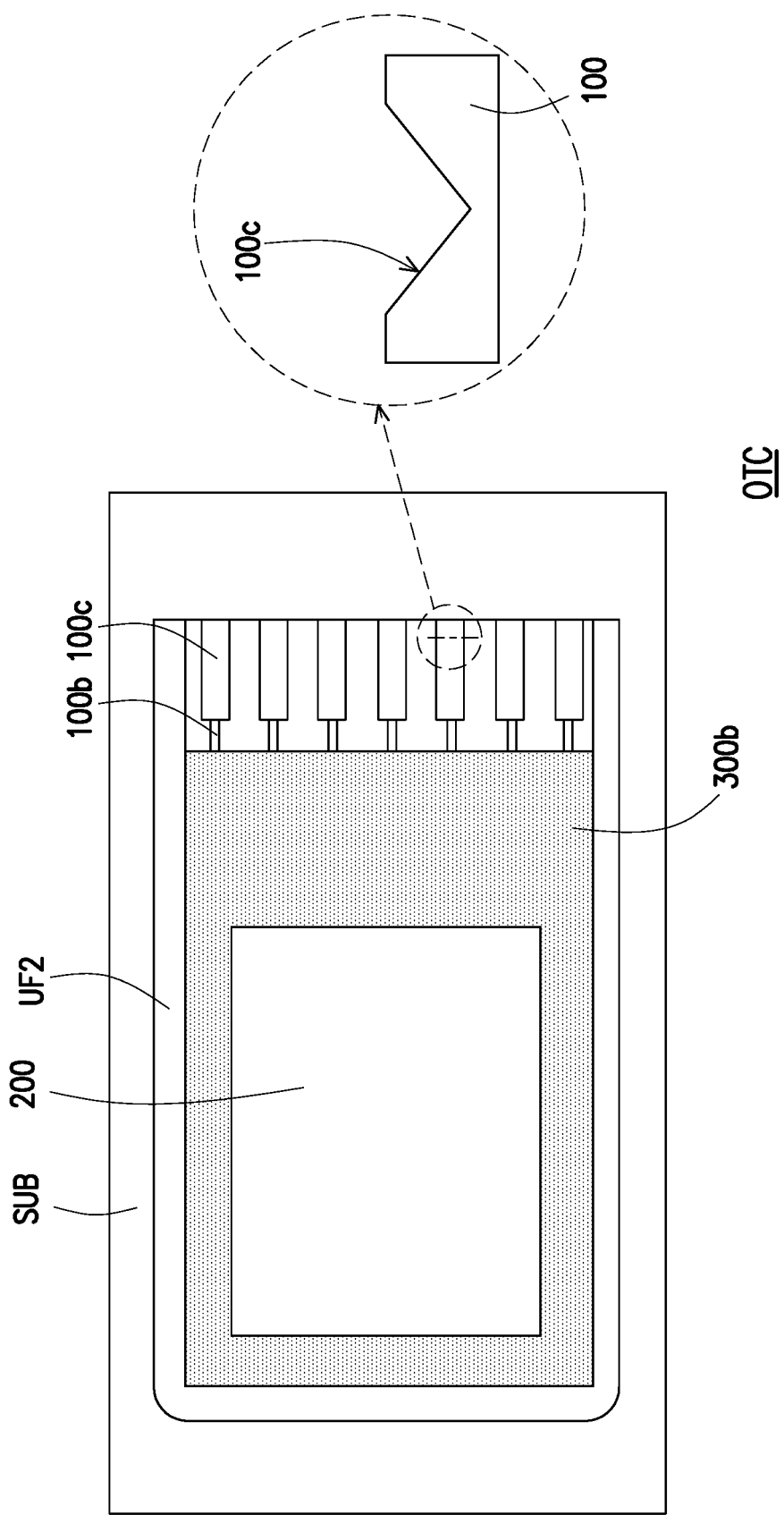
FIG. 14B is a schematic view of the optical transceiver illustrated in FIG. 13 in accordance with some alternative embodiments of the present disclosure.

FIGS. 1 through 13 illustrate a process flow for fabricating an optical transceiver in accordance with some embodiments of the present disclosure. FIG. 14A is a schematic view of the optical transceiver illustrated in FIG. 13 in accordance with some embodiments of the present disclosure. FIG. 14B is a schematic view of the optical transceiver illustrated in FIG. 13 in accordance with some alternative embodiments of the present disclosure.

Referring to FIG. 1, an interposer INT including a plurality of photonic integrated circuit components 100 therein is provided. The photonic integrated circuit components 100 are arranged in array and physically connected to one another. Each photonic integrated circuit components 100 among the photonic integrated circuit components 100 may respectively include an electrical bonding portion 100a, at least one optical input/output portion 100b configured to transmit and receive optical signal, and at least one groove 100c located in proximity of the at least one optical input/output portion 100b. The optical signal is, for example, pulsed light, light with continuous wave (CW) or the combination thereof. In some embodiments, the electrical bonding portions 100a of the photonic integrated circuit components 100 may include semiconductor devices (e.g., transistors, capacitors and so on), wirings or conductors for electrical connection, and the optical input/output portions 100b of the photonic integrated circuit components 100 may include semiconductor devices and optical devices (e.g., grating coupler) for processing the optical signal. For example, the semiconductor devices formed in the optical input/output portions 100b may include transistors, capacitors, photodiodes or the combination thereof, and the optical devices formed in the optical input/output portions 100b may include modulators, grating couplers, edge couplers, waveguides, filters or the combination thereof. As shown in FIG. 1, the interposer INT may include a first active surface AS1 and a first rear surface RS1 opposite to the first active surface AS1, wherein the electrical bonding portions 100a, the optical input/output portions 100b and the groove 100c of the photonic integrated circuit components 100 are formed at the first active surface AS1 of the interposer INT. In some embodiments, a plurality of grooves 100c may be formed on the first active surface AS1 of the interposer and the grooves 100c may be V-grooves formed by etching or other suitable processes. The number of the groove(s) is not limited in this disclosure.

As shown in FIG. 1, the interposer INT may further include a plurality of conductive bumps B1 formed on the first active surface AS1 thereof. In some embodiments, the conductive bumps B1 may be micro-bumps (e.g., solder bumps, copper bumps or other metallic bumps) formed on the first active surface AS1 of the interposer INT. For example, a plurality of groups of conductive bumps B1 may be formed on the interposer INT, and each group of conductive bumps B1 may be formed on one of the photonic integrated circuit components 100 respectively.

As shown in FIG. 1, a plurality of electric integrated circuit components 200 are provided and mounted onto the interposer INT. In some embodiments, the electric integrated circuit components 200 may be picked and placed onto the first active surface AS1 of the interposer INT such that the electric integrated circuit components 200 may cover the electrical bonding portions 100a of photonic integrated circuit components 100, and the optical input/output portions 100b of the photonic integrated circuit components 100 may not be covered or shielded by the electric integrated circuit components 200. Each one of the electric integrated circuit components 200 may respectively include a second active surface AS2 and a second rear surface RS2 opposite to the second active surface AS2. After the electric integrated circuit components 200 are picked and placed onto the interposer INT, the second active surface AS2 of the electric integrated circuit components 200 may face the interposer INT and the electric integrated circuit components 200 may be bonded with the interposer INT through the conductive bumps B1. For example, a reflow process of the conductive bumps B1 may be performed to facilitate the bonding between the electric integrated circuit components 200 and the interposer INT. In some embodiments, the number of the electric integrated circuit components 200 may be equal to the number of photonic integrated circuit components 100 included in the interposer INT. In some alternative embodiments, the number of the electric integrated circuit components 200 may be greater than the number of photonic integrated circuit components 100 included in the interposer INT. The number of the electric integrated circuit components 200 is not limited in this disclosure.

In some embodiments, after performing the above-mentioned reflow process of the conductive bumps B1, an underfill UF1 may be formed between the electric integrated circuit components 200 and the interposer INT to as to laterally encapsulate the conductive bumps B1. The underfill UF1 not only protects the conductive bumps B1 from fatigue but also enhances bonding reliability between the electric integrated circuit components 200 and the interposer INT. In some alternative embodiments, the formation of the underfill UF1 may be omitted.

Although the bonding and electrical connection (shown in FIG. 1) between the electric integrated circuit components 200 and the interposer INT is achieved by the conductive bumps B1 encapsulated by the underfill UF1, the bonding and electrical connection between the electric integrated circuit components 200 and the interposer INT of this disclosure is not limited thereto and other suitable chip-to-wafer bonding processes (e.g., a chip-to-wafer hybrid bonding process) may be utilized.

Figure 2:
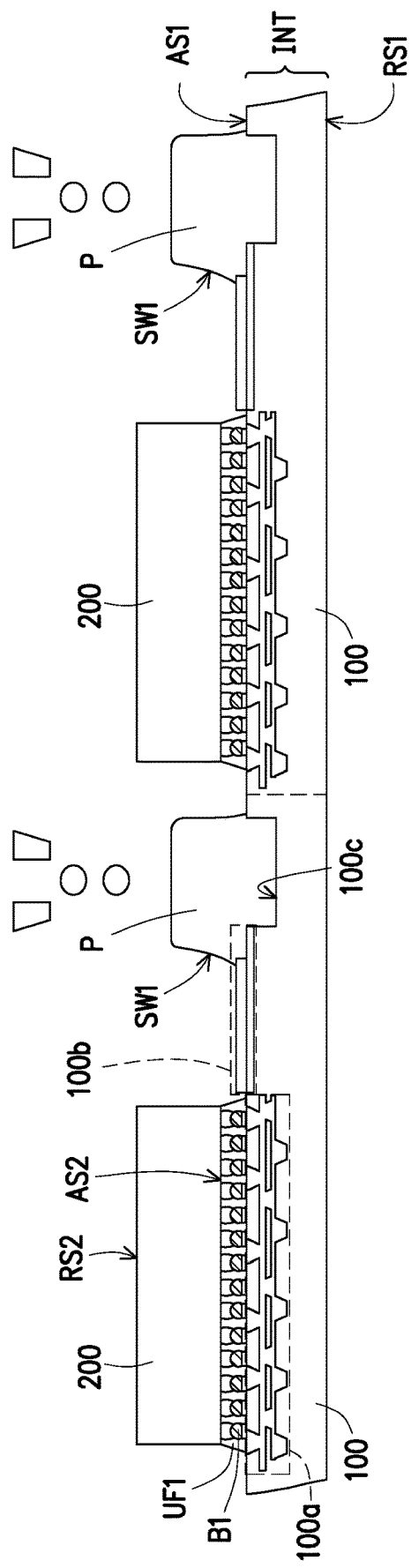

Referring to FIG. 2, after bonding the electric integrated circuit components 200 with the interposer INT, a plurality of protrusions P are formed on the first active surface AS1 of the interposer INT to cover the grooves 100c. The protrusions P fill the grooves 100c and protrude from the first active surface AS1 of the interposer INT. The grooves 100c may enhance adhesion between the interposer INT and the protrusions P. In some embodiments, the protrusions P not only cover the grooves 100c but also cover portions of the optical input/output portions 100b, and the portions of the optical input/output portions 100b covered by the protrusions P are located in proximity of the grooves 100c. In some embodiments, the number of the protrusions P may be equal to the number of the optical input/output portions 100b of the photonic integrated circuit components 100.

As shown in FIG. 2, the protrusions P may have a curved and tapered sidewall SW1 and the curved and tapered sidewall SW1 of the protrusions P are located above the optical input/output portions 100b. The protrusions P are formed to temporarily occupy the space for insertion of the photonic devices PD (as shown in FIG. 13). In other words, the protrusions P are utilized to define the insertion position of the photonic devices PD. Since the protrusions P are formed to determine and temporarily occupy the space for insertion of the photonic devices PD, the geometry of the protrusions P may be designed and fabricated on the interposer INT according to the geometry of coupling portions of the photonic devices PD to be inserted.

In some embodiments, the protrusions P may be formed on the interposer INT through a printing process (e.g., a three-dimensional printing process), and the protrusions P may be formed by ink or other suitable dielectric polymer (e.g., PI, Epoxy, Acrylic, and so on). The height of the protrusions P formed on the interposer INT may be greater than the depth of the grooves 100c. For example, the height of the protrusions P may range from about 40 um to about 3000 um and the depth of the grooves 100c may range from about 20 um to about 1500 um. Furthermore, as shown in FIG. 2, in some embodiments, the top surfaces of the protrusions P are lower than the second rear surfaces RS2 of the electric integrated circuit components 200. In some alternative embodiments, not shown in figures, the top surfaces of the protrusions P may be substantially level with the second rear surfaces RS2 of the electric integrated circuit components 200.

Figure 3:
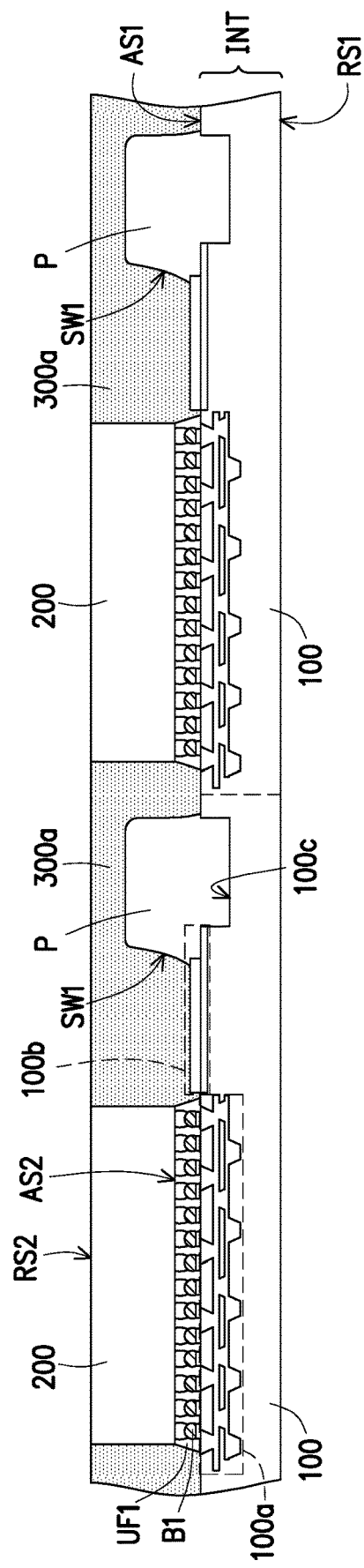

Referring to FIG. 3, an insulating encapsulant 300a is formed on the interposer INT so as to encapsulate the electric integrated circuit components 200, the underfill UF1 and the protrusions P. In some embodiments, the insulating encapsulant 300a may be formed by an over-mold process followed by a first grinding process. During the over-mold process, an insulating molding material is formed on the interposer INT to encapsulate the electric integrated circuit components 200, the underfill UF1 and the protrusions P such that the electric integrated circuit components 200, the underfill UF1 and the protrusions P are not revealed. Then, the insulating molding material is ground or polished (i.e. the first grinding process) until the second rear surfaces RS2 of the electric integrated circuit components 200 are exposed. After performing the grinding process, the insulating encapsulant 300a is formed on the interposed INT. As shown in FIG. 3, since the top surfaces of the protrusions P are lower than the second rear surfaces RS2 of the electric integrated circuit components 200, the protrusions P are not exposed by the insulating encapsulant 300a after performing the first grinding process. The first grinding process of the insulating mold material may be a chemical mechanical polishing (CMP) process, a mechanical grinding process, the combination thereof or other suitable processes.

In some alternative embodiments, not shown in figures, when the top surfaces of the protrusions P may be substantially level with the second rear surfaces RS2 of the electric integrated circuit components 200, the protrusions P are exposed by the insulating encapsulant 300a after performing the first grinding process. In addition, an additional grinding process (e.g., a grinding process described in FIG. 7) is not needed when the protrusions P are already exposed by the insulating encapsulant 300a after performing the first grinding process.

Figure 4:
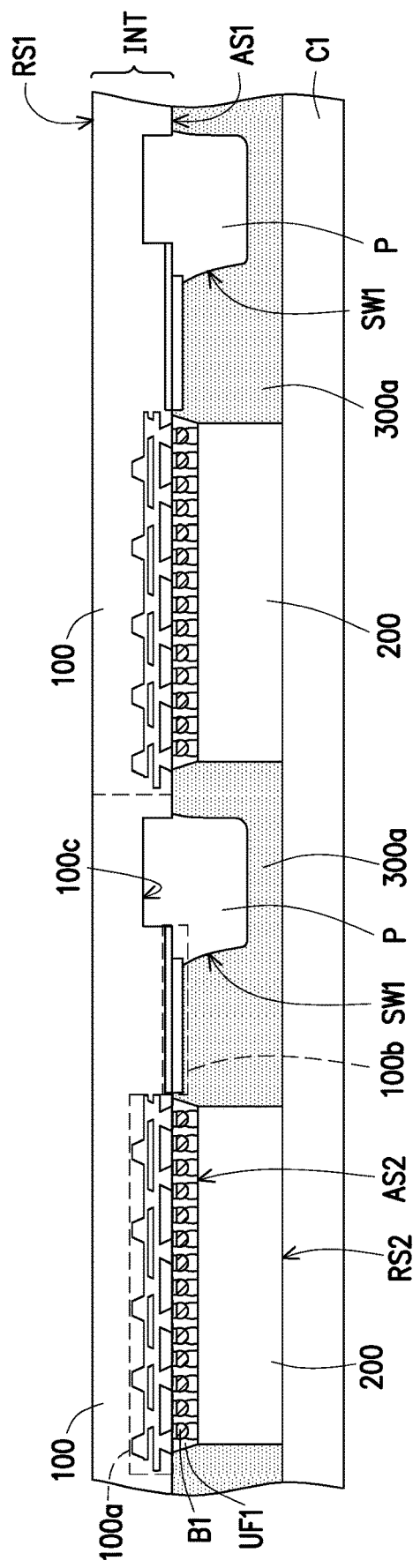

Referring to FIG. 3 and FIG. 4, after forming the insulating encapsulant 300a, the resulted structure shown in FIG. 3 is transfer bonded onto a carrier C1 such that the second rear surfaces RS2 of the electric integrated circuit components 200 and the insulating encapsulant 300a are bonded with the carrier C1. In some embodiments, the carrier C1 may be a semiconductor wafer (e.g., silicon wafer) or other suitable substrates capable of carrying the resulted structure shown in FIG. 3.

Figure 5:
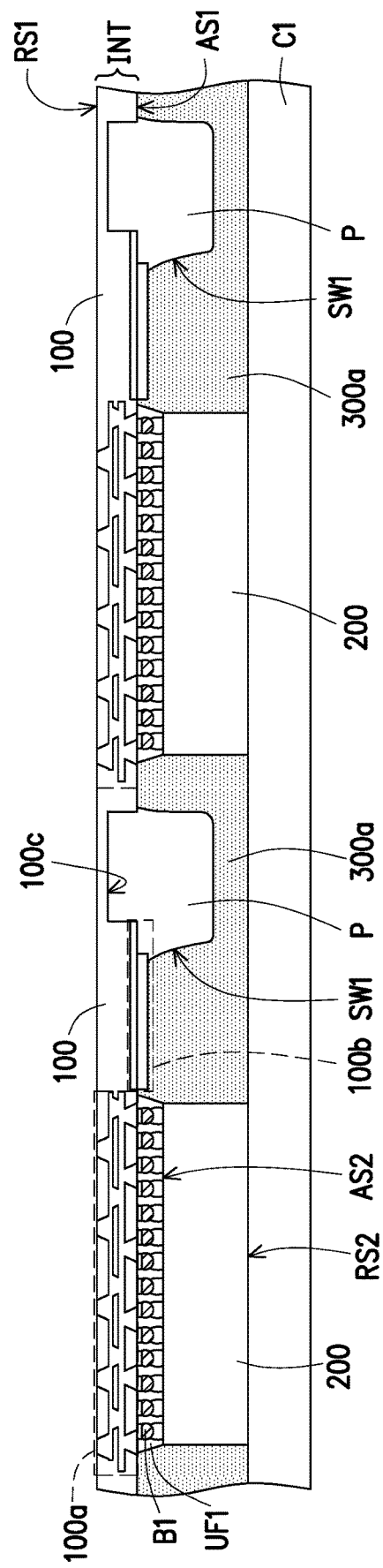

Referring to FIG. 4 and FIG. 5, a thinning process is performed to reduce the thickness of the interposer INT. In some embodiments, a grinding or polishing process may be performed on the first rear surface RS1 of the interposed INT until the electrical bonding portions 100a of the photonic integrated circuit components 100 are revealed. The grinding process of the interposer INT may be a chemical mechanical polishing (CMP) process, a mechanical grinding process, the combination thereof or other suitable processes.

Figure 6:
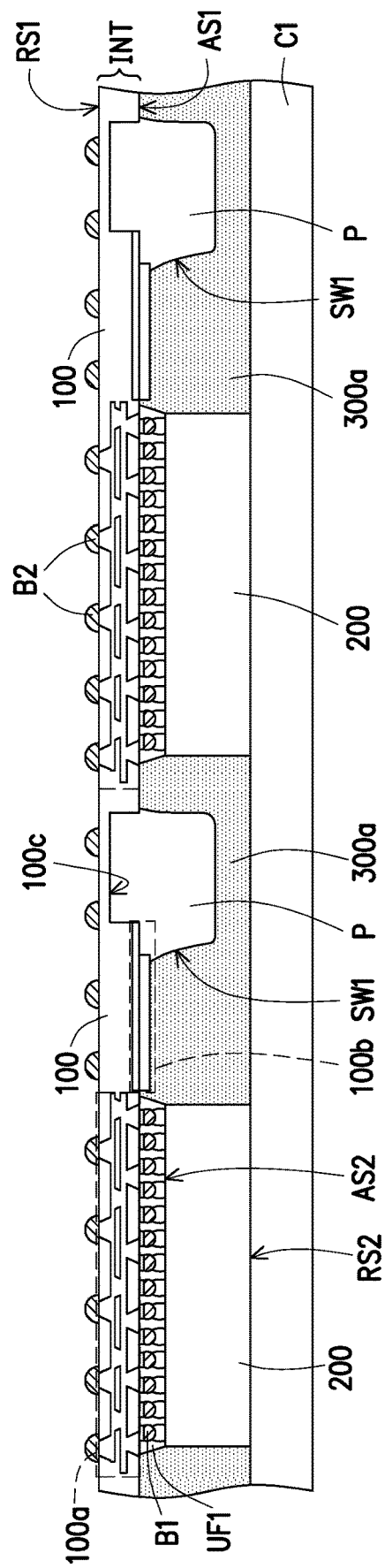

Referring to FIG. 5 and FIG. 6, after performing the thinning process of the interposer INT, a plurality of conductive bumps B2 may be formed on the first rear surface RS1 of the interposer INT. In some embodiments, the conductive bumps B2 formed on the first rear surface RS1 of the interposer INT may be controlled collapse chip connection bumps (C4 bumps). For example, a plurality of groups of conductive bumps B2 may be formed on the first rear surface RS1 of the interposer INT, and each group of conductive bumps B2 may be formed on one of the photonic integrated circuit components 100 respectively.

Figure 7:
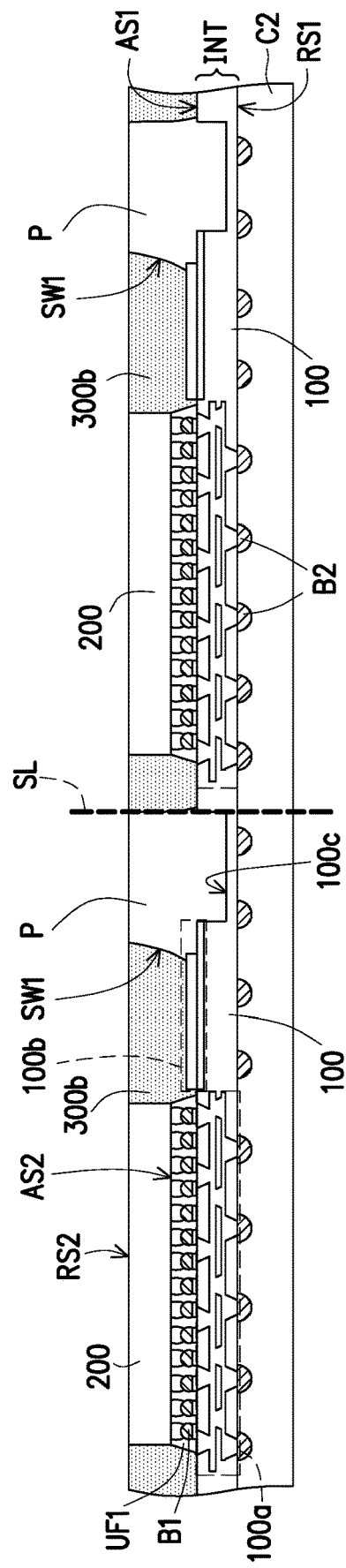

Referring to FIG. 6 and FIG. 7, after forming the conductive bumps B2 on the first rear surface RS1 of the interposer INT, a transfer bonding process is performed to transfer the resulted structure carried by the carrier C1 from the carrier C1 onto another carrier C2. In some embodiments, the resulted structure carried by the carrier C1 may be flip onto the carrier C2 such that the conductive bumps B2 and the first rear surface RS1 of the interposer INT are adhered with the carrier C2. Then, a de-bonding process of the carrier C1 is performed. For example, the carrier C2 may be a saw tape adhered with the conductive bumps B2 and the first rear surface RS1 of the interposer INT, and the conductive bumps B2 may be protected by the saw tape.

As shown in FIG. 6 and FIG. 7, a second grinding process of the insulating encapsulant 300a is performed. The second grinding process is performed on the top surface of the insulating encapsulant 300a and the second rear surfaces RS2 of the electric integrated circuit components 200 until the protrusions P are revealed. After performing the second grinding process of the insulating encapsulant 300a, an insulating encapsulant 300b is formed on the interposer INT so as to laterally encapsulate the electric integrated circuit components 200 and the protrusions P. In addition, after performing the second grinding process of the insulating encapsulant 300a, the thickness of the electric integrated circuit components 200 is reduced and the protrusions P are revealed.

Figure 8:
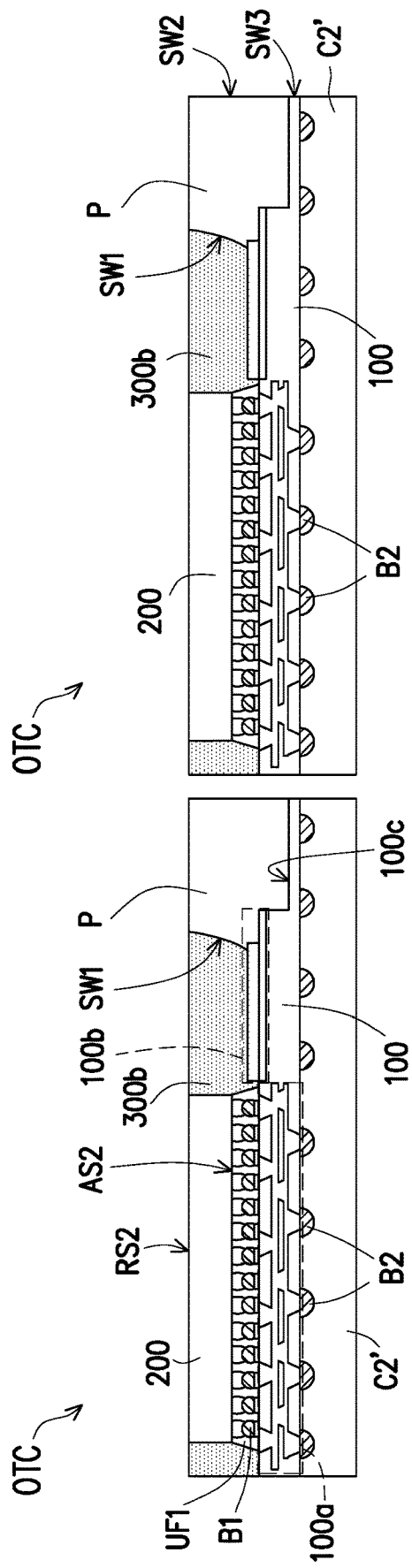

Referring to FIG. 7 and FIG. 8, a singulation process is performed along scribe lines SL (shown in FIG. 7) such that the resulted structure carried by the carrier C2 is singulated into a plurality of singulated optical transceivers OTC and each of the singulated optical transceivers OTC is carried by a singulated carrier C2'. As shown in FIG. 8, each one of the singulated optical transceivers OTC may include at least one photonic integrated circuit component 100, at least one electric integrated circuit component 200, the insulating encapsulant 300b and a protrusion P. The at least one photonic integrated circuit component 100 includes at least one electrical bonding portion 100a, at least one optical input/output portion 100b, and at least one groove 100c located in proximity of the at least one optical input/output portion 100b. In addition, the electric integrated circuit component 200 is disposed on and electrically connected to the electrical bonding portion 100a of the photonic integrated circuit component 100. The protrusion P at least covers a portion of the at least one optical input/output portion 100b of the photonic integrated circuit component 100.

As shown in FIG. 7 and FIG. 8, during the singulation process, the interposer INT and the carrier C2 are cut off and portions of the protrusions P may be removed. In the singulated optical transceiver OTC, at least one sidewall SW2 of the protrusion P may be revealed and substantially aligned with the curved sidewall SW3 of the photonic integrated circuit components 100.

Figure 9:
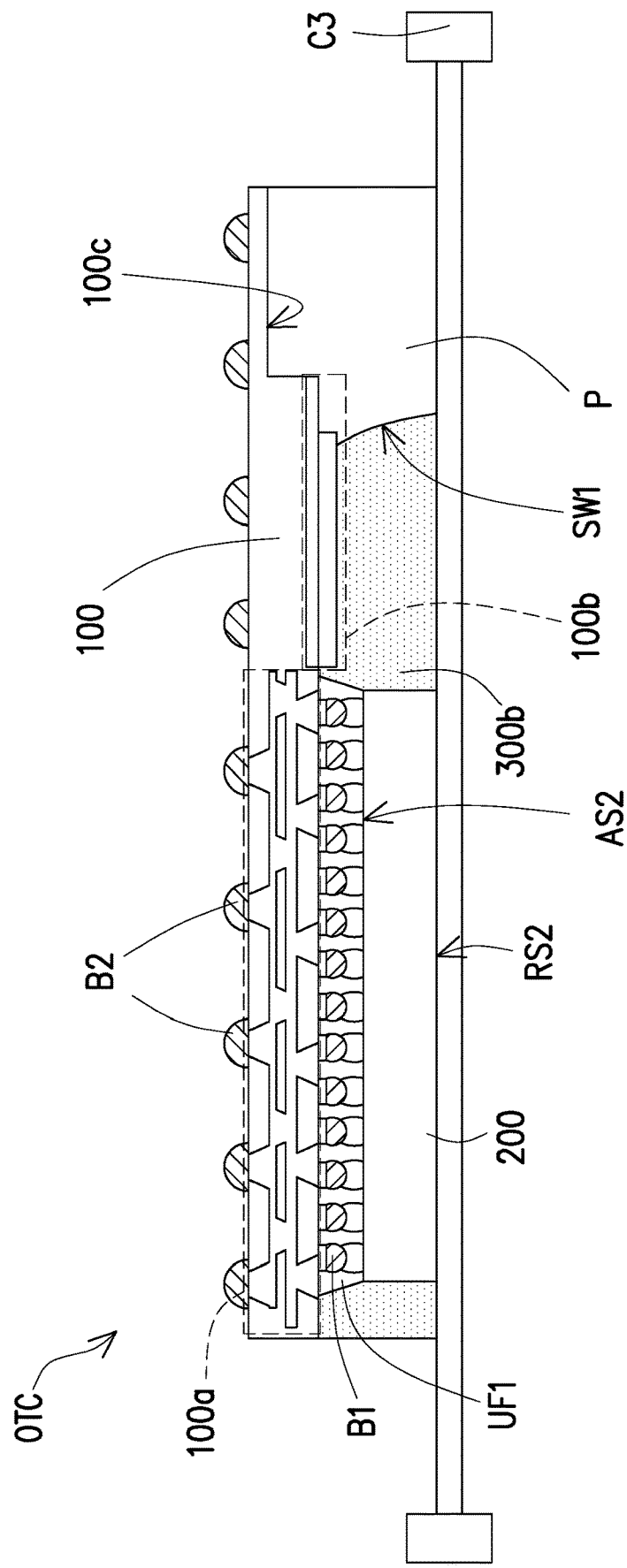

Referring to FIG. 8 and FIG. 9, a transfer bonding process is performed to transfer at least one of the singulated optical transceivers OTC from the singulated carriers C2' onto a carrier C3. In some embodiments, the at least one singulated optical transceiver OTC carried by the singulated carrier C2' is mounted on to the carrier C3 (e.g., a frame for supporting the singulated optical transceiver OTC) through a frame mount process, and the singulated carrier C2' is then removed from the singulated optical transceiver OTC such that the group of conductive bumps B2 of the singulated optical transceiver OTC may be revealed.

Figure 10:
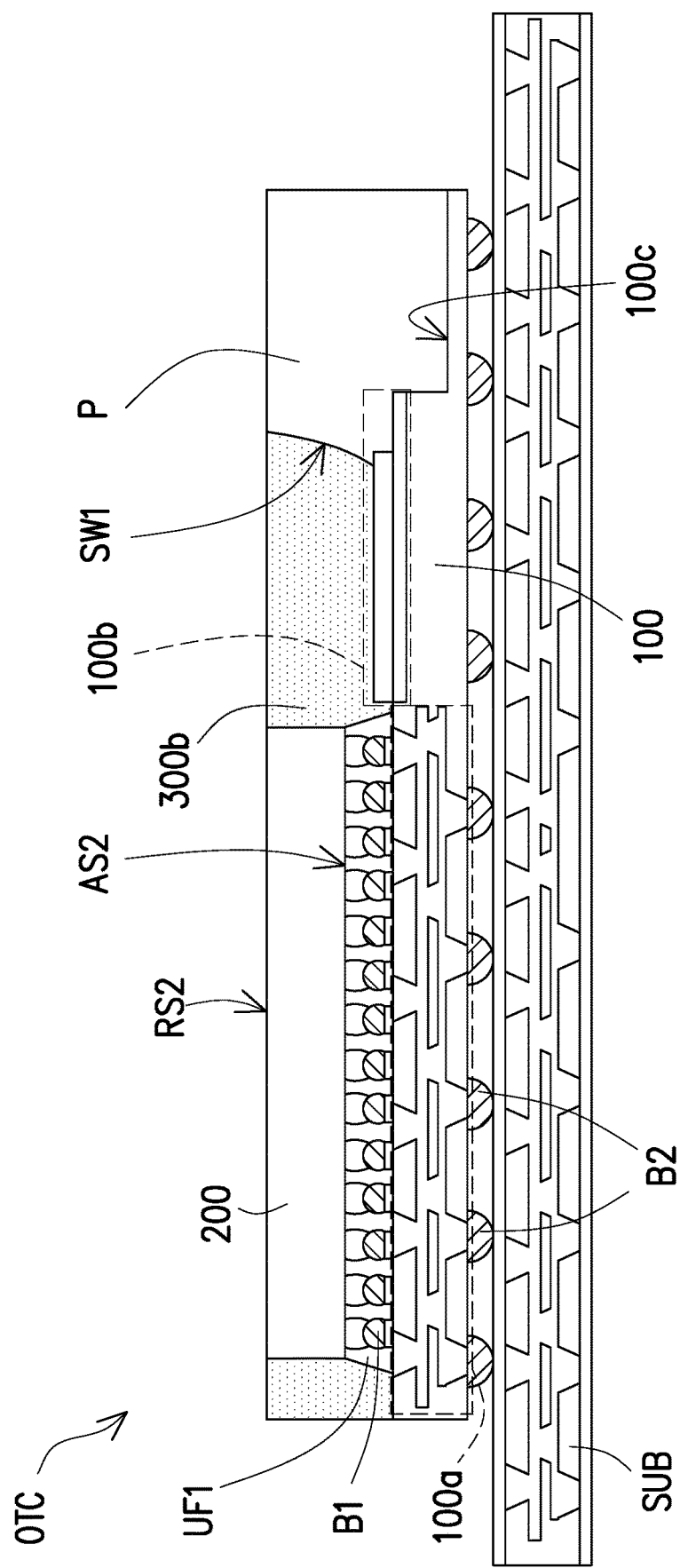

Referring to FIG. 9 and FIG. 10, a wiring substrate SUB is provided. The at least one singulated optical transceiver OTC is mounted onto and electrically connected to the wiring substrate SUB through the group of conductive bumps B2. For example, a reflow process of the conductive bumps B2 may be performed to facilitate the bonding between the at least one singulated optical transceiver OTC and the wiring substrate SUB.

Figure 11:
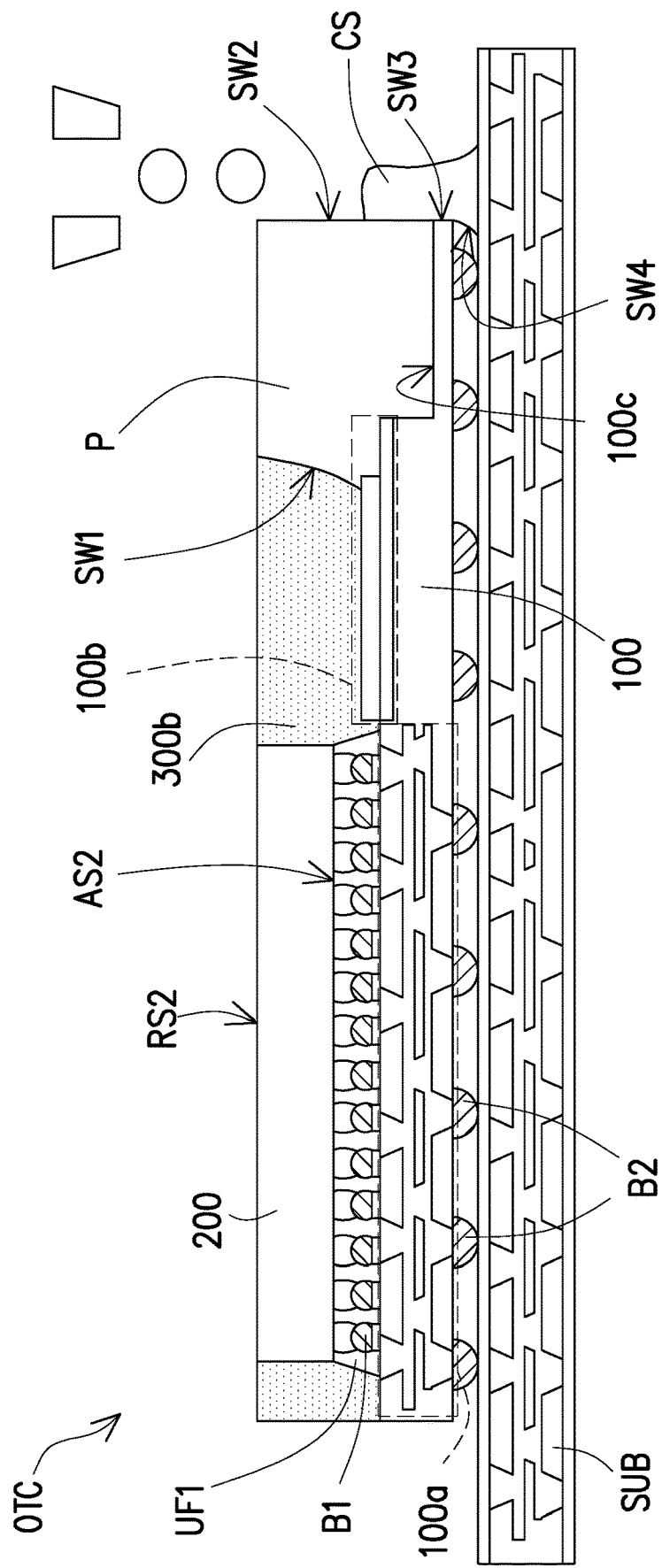

Referring to FIG. 11, after performing the above-mentioned reflow process of the conductive bumps B2, a confining structure CS (e.g., a dam) may be formed on the wiring substrate SUB and the confining structure CS may be formed at a side of the singulated optical transceiver OTC. In some embodiments, the confining structure CS may extend upwardly from the wiring substrate SUB and may be in contact with the sidewalls SW2 of the protrusion P and the curved sidewall SW3 of the photonic integrated circuit components 100. As shown in FIG. 11, the sidewalls SW2 of the protrusion P may be partially covered by the confining structure CS. For example, the height of the confining structure CS formed on the wiring substrate SUB may range from about 10 um to about 500 um. In addition, the bottom portion of the confining structure CS may have a curved and tapered sidewall SW4 and the curved and tapered sidewall SW4 of the confining structure CS are located under the groove 100c.

In some embodiments, the confining structure CS may be formed on the wiring substrate SUB through a printing process (e.g., a three-dimensional printing process), and the confining structure CS may be formed by ink or other suitable dielectric material (e.g., PI, Epoxy, Acrylic, and so on).

Figure 12:
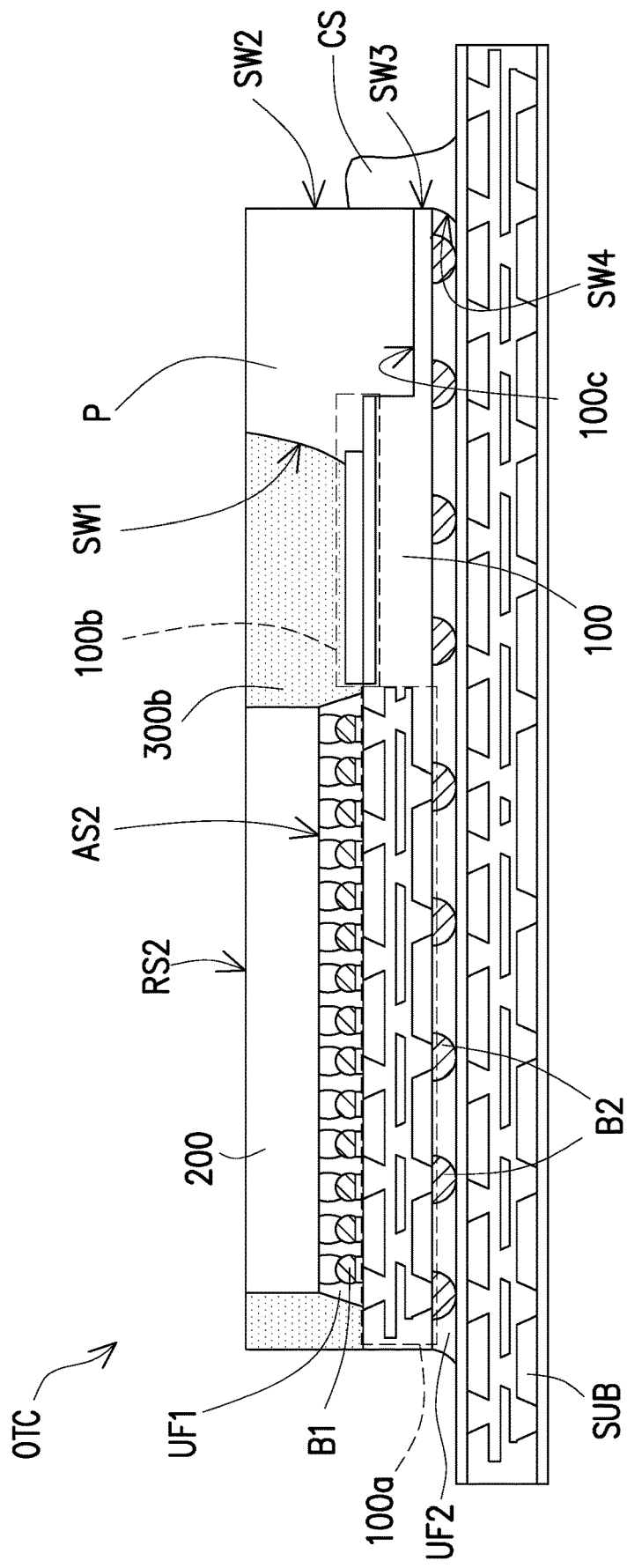

Referring to FIG. 12, in some embodiments, an underfill UF2 may be formed between the singulated optical transceiver OTC and the wiring substrate SUB to as to laterally encapsulate the conductive bumps B2. The distribution of the underfill UF2 is confined by the confining structure CS. In other words, the underfill UF2 in proximity of the confining structure CS may not laterally exceed beyond the sidewalls (e.g., the sidewalls SW2 and SW3) of the singulated optical transceiver OTC. The underfill UF2 not only protects the conductive bumps B2 from fatigue but also enhances bonding reliability between the singulated optical transceiver OTC and the wiring substrate SUB. In some alternative embodiments, the formation of the confining structure CS and the underfill UF2 may be omitted.

Referring to FIGS. 12 and 13, after forming the underfill UF2, the confining structure CS and the protrusion P of the singulated optical transceiver OTC may be removed such that the groove 100c and portions of the optical input/output portion 100b of the photonic integrated circuit components 100 are revealed. In some embodiments, the confining structure CS and the protrusion P are removed by wet etch or dry etch.

As shown in FIG. 13, the singulated optical transceiver OTC includes the photonic integrated circuit component 100, the electric integrated circuit component 200 and the insulating encapsulant 300b. The photonic integrated circuit component. 100 at least includes at least one optical input/output portion 100b and at least one groove 100c located in proximity of the at least one optical input/output portion 100b. The electric integrated circuit component 200 is disposed on and electrically connected to the photonic integrated circuit component 100. The insulating encapsulant 300b is disposed on the photonic integrated circuit component 100 and laterally encapsulating the electric integrated circuit component 200. In addition, a portion of the at least one optical input/output portion 100b and the at least one groove 100c (e.g., V-grooves illustrated in FIG. 14A or FIG. 14B) of the photonic integrated circuit component 100 is revealed by the insulating encapsulant 300b and is adapted for insertion of at least one photonic device PD.

In some embodiments, the singulated optical transceiver OTC may further include the conductive bumps B1 (e.g., micro-bumps) and the underfill UF1 disposed between the electric integrated circuit component 200 and the photonic integrated circuit component 100, wherein the electric integrated circuit component 200 may be electrically connected to the photonic integrated circuit component 100 through the conductive bumps B1. In some alternative embodiments, the singulated optical transceiver OTC may further include a hybrid bonding interface (not shown) between the electric integrated circuit component 200 and the photonic integrated circuit component 100, wherein the electric integrated circuit component 200 may be electrically connected to the photonic integrated circuit component 100 through the hybrid bonding interface which includes metal-to-metal bonding interface and dielectric-to-dielectric bonding interface.

In some embodiments, the singulated optical transceiver OTC may further include the conductive bumps B2 and the underfill UF2 disposed between the wiring substrate SUB and the photonic integrated circuit component 100, wherein the photonic integrated circuit component 100 is electrically connected to the wiring substrate SUB through the conductive bumps B2, and the conductive bumps B2 are laterally encapsulated by the underfill UF2.

As shown in the region A of FIG. 13, in some embodiments, a portion of the insulating encapsulant 300b which is located above the at least one optical input/output portion 100b of the photonic integrated circuit component 100 may include a curved and tapered sidewall SW5. The portion of the insulating encapsulant 300b which includes the curved and tapered sidewall SW5 may be located in proximity of the at least one groove 100c of the photonic integrated circuit component 100. In addition, as shown in FIG. 13, a top dimension w1 of the portion of the insulating encapsulant 300b is greater than a bottom dimension w2 of the portion of the insulating encapsulant 300b. The profile of the curved and tapered sidewall SW5 of the insulating encapsulant 300b is relevant to and may be determined by the geometry of the protrusion P as shown in FIG. 8. In other words, the profile of the curved and tapered sidewall SW5 of the insulating encapsulant 300b is relevant to and may be determined by the curved and tapered sidewall SW1 of the protrusion P as shown in FIG. 8.

As shown in the region B of FIG. 13, in some embodiments, a portion of the underfill UF2 which is located under the at least one groove 100c of the photonic integrated circuit component 100 may include a curved and tapered sidewall SW6. In addition, a top dimension w3 of the portion of the underfill UF2 is greater than a bottom dimension w4 of the portion of the underfill UF2. The profile of the curved and tapered sidewall SW6 of the underfill UF2 is relevant to and may be determined by the geometry of the confining structure CS as shown in FIG. 11. In other words, the profile of the curved and tapered sidewall SW6 of the underfill UF2 is relevant to and may be determined by the profile of the curved and tapered sidewall SW4 of the confining structure CS as shown in FIG. 11.

In some embodiments, as shown in FIG. 14A, from the top views of the optical transceiver OTC, the insulating encapsulant 300b includes a plurality of slots such that portions of the optical input/output portion 100b and the grooves 100c are exposed by the slots of the insulating encapsulant 300b. In some alternative embodiments, as shown in FIG. 14B, from the top views of the optical transceiver OTC, the insulating encapsulant 300b is not distributed over the grooves 100c such that portions of the optical input/output portion 100b and the grooves 100c are exposed by the insulating encapsulant 300b.

Figure 15A:
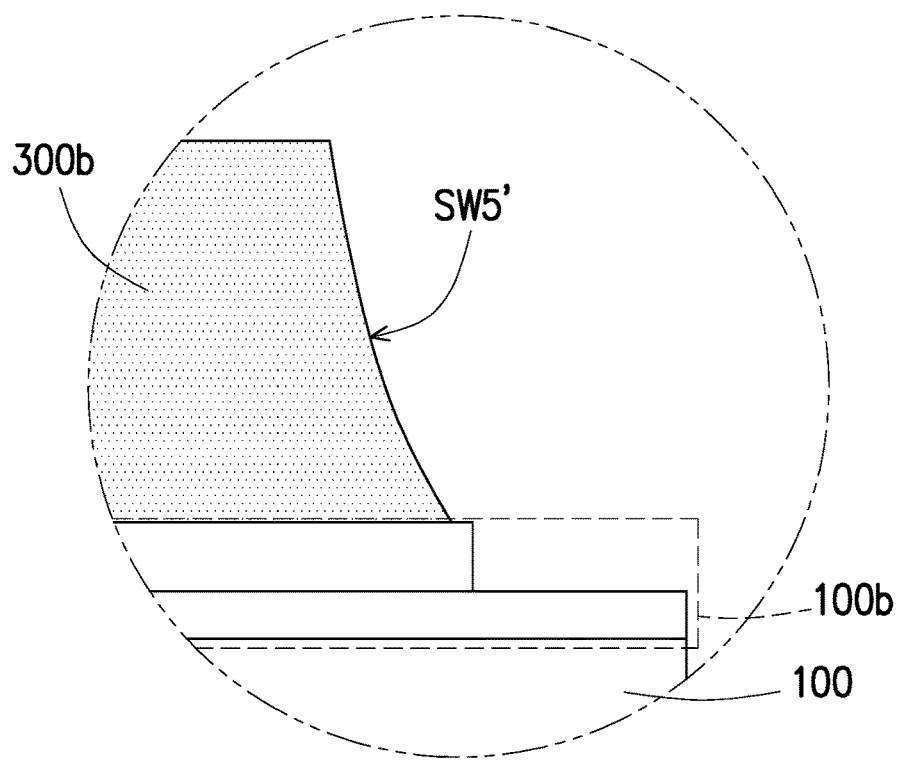
FIG. 15A is a cross-sectional view schematically illustrating the region A shown in FIG. 13 in accordance with some embodiments of the present disclosure.

FIG. 15A is a cross-sectional view schematically illustrating the region A shown in FIG. 13 in accordance with some embodiments of the present disclosure. Referring to FIG. 15A, the portion of the insulating encapsulant 300b which is located above the at least one optical input/output portion 100b of the photonic integrated circuit component 100 may include a curved and tapered sidewall SW5', wherein the top dimension of the portion of the insulating encapsulant 300b is smaller than the bottom dimension of the portion of the insulating encapsulant 300b. In addition, the portion of the insulating encapsulant 300b which includes the curved and tapered sidewall SW5' may be located in proximity of the at least one groove 100c of the photonic integrated circuit component 100.

Figure 15B:
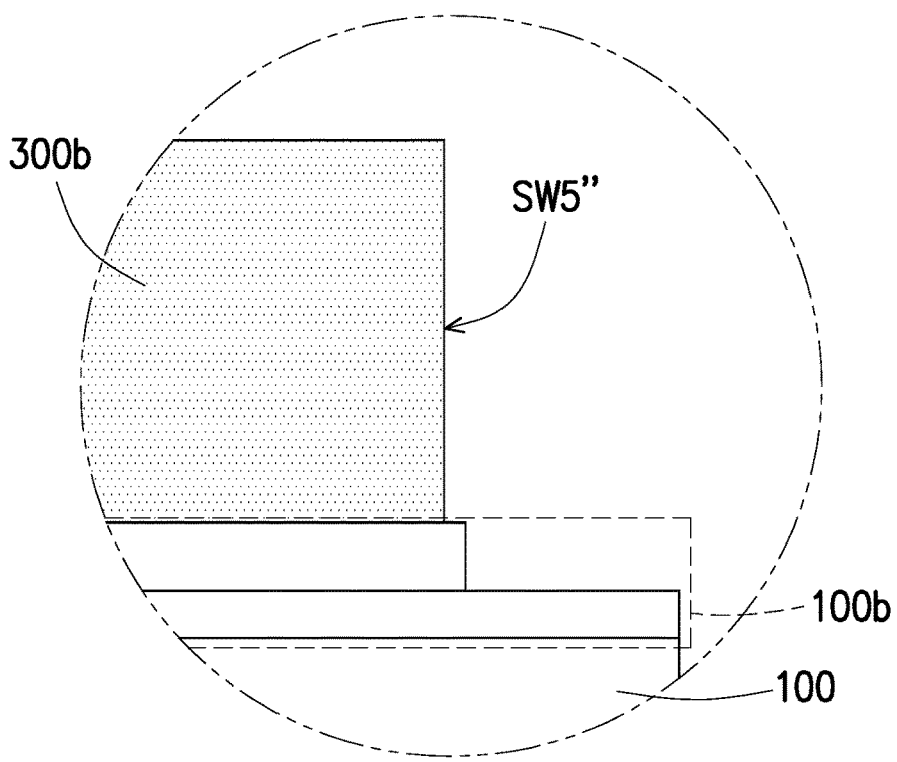
FIG. 15B is a cross-sectional view schematically illustrating the region A shown in FIG. 13 in accordance with some alternative embodiments of the present disclosure.

FIG. 15B is a cross-sectional view schematically illustrating the region A shown in FIG. 13 in accordance with some alternative embodiments of the present disclosure. Referring to FIG. 15B, the portion of the insulating encapsulant 300b which is located above the at least one optical input/output portion 100b of the photonic integrated circuit component 100 may include a straight and vertical sidewall SW5", wherein the top dimension of the portion of the insulating encapsulant 300b is substantially equal to the bottom dimension of the portion of the insulating encapsulant 300b. In addition, the portion of the insulating encapsulant 300b which includes the curved and tapered sidewall SW5" may be located in proximity of the at least one groove 100c of the photonic integrated circuit component 100.

Figure 16A:
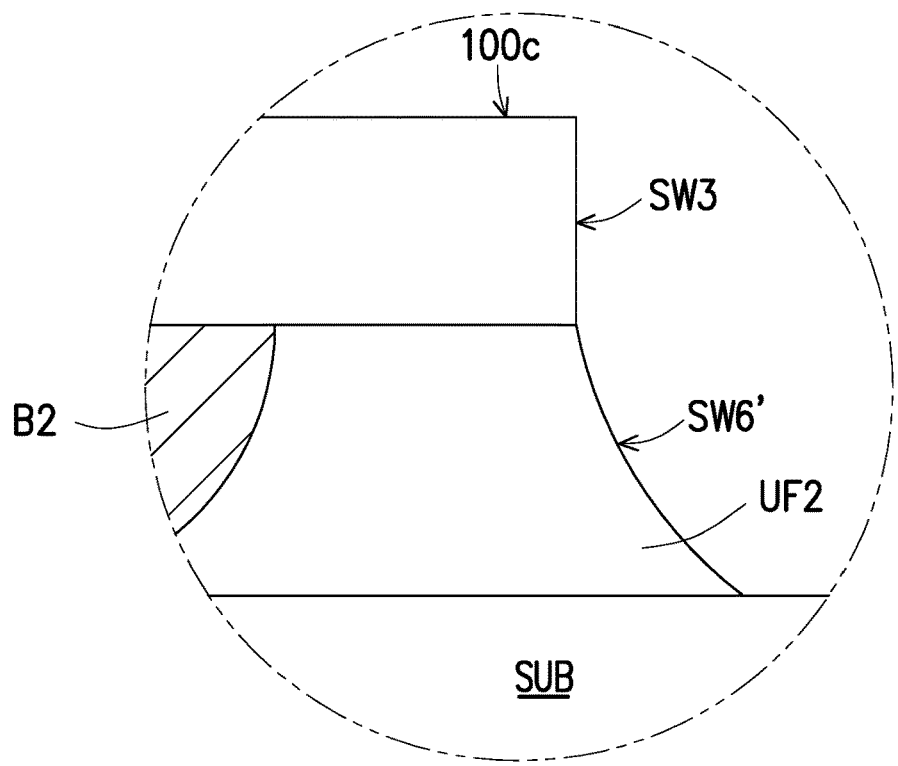
FIG. 16A is a cross-sectional view schematically illustrating the region B shown in FIG. 13 in accordance with some embodiments of the present disclosure.

FIG. 16A is a cross-sectional view schematically illustrating the region B shown in FIG. 13 in accordance with some embodiments of the present disclosure. Referring to FIG. 16A, the portion of the underfill UF2 which is located under the at least one groove 100c of the photonic integrated circuit component 100 may include a curved and tapered sidewall SW6', wherein the top dimension of the portion of the underfill UF2 is smaller than the bottom dimension of the portion of the underfill UF2. The top end of the curved and tapered sidewall SW6' may be substantially aligned with the sidewall SW3 of the photonic integrated circuit component 100 and the bottom end of the curved and tapered sidewall SW6' may laterally exceed beyond the sidewall SW3 of the photonic integrated circuit component 100. In other words, the underfill UF2 may laterally exceed beyond the sidewall SW3 of the photonic integrated circuit component 100 slightly.

Figure 16B:
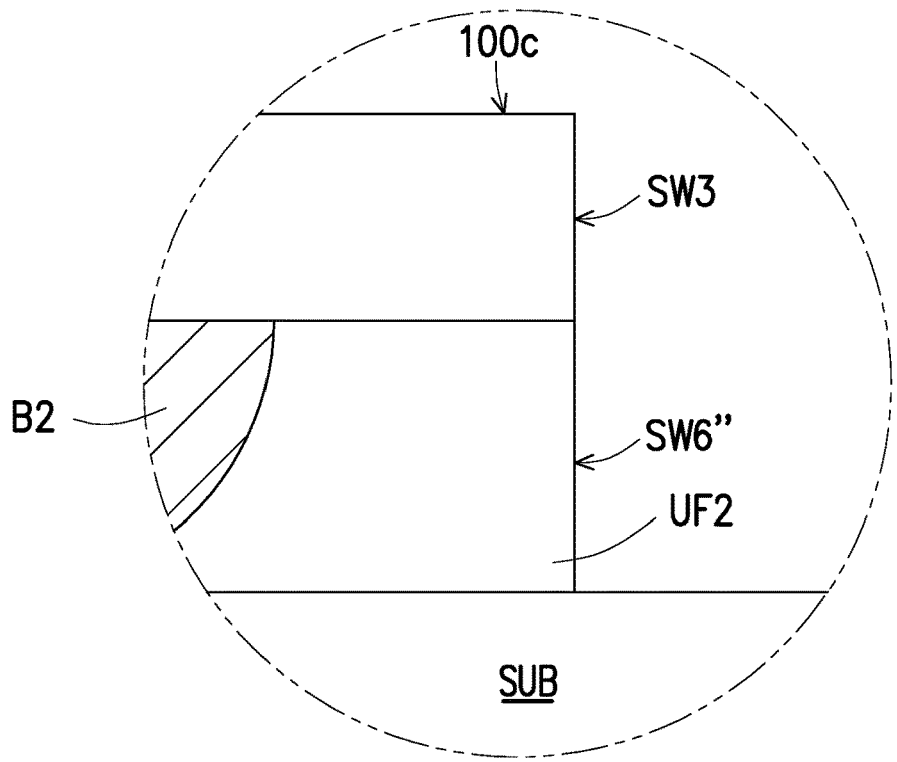
FIG. 16B is a cross-sectional view schematically illustrating the region B shown in FIG. 13 in accordance with some alternative embodiments of the present disclosure.

FIG. 16B is a cross-sectional view schematically illustrating the region B shown in FIG. 13 in accordance with some alternative embodiments of the present disclosure. Referring to FIG. 16B, the portion of the underfill UF2 which is located under the at least one groove 100c of the photonic integrated circuit component 100 may include a straight and vertical sidewall SW6", wherein the top dimension of the portion of the underfill UF2 is substantially equal to the bottom dimension of the portion of the underfill UF2. In other words, the straight and vertical sidewall SW6" of the photonic integrated circuit component 100 may be substantially aligned with the sidewall SW3 of the underfill UF2.

The profiles or geometries of the insulating encapsulant 300b and the underfill UF2 illustrated in FIG. 13 are not limited and may be modified. In some embodiments, the profile or geometry of the insulating encapsulant 300b illustrated in FIG. 13 may be modified into the profile or geometry of the insulating encapsulant 300b illustrated in FIG. 15A or FIG. 15B. In some alternative embodiments, the profile or geometry of the underfill UF2 illustrated in FIG. 13 may be modified into the profile or geometry of the underfill UF2 illustrated in FIG. 16A or figure16B.

The at least one groove 100c of the photonic integrated circuit component 100 is protected by the protrusion P during processes as illustrated in FIGS. 2 through 12, the yield rate of the manufacturing process of the optical transceiver OTC may be increased accordingly. Furthermore, since the protrusion P may be formed through three-dimensional printing and may be removed through etch, the fabrication complexity of the optical transceiver OTC may be reduced.

In accordance with some embodiments of the disclosure, an optical transceiver including a photonic integrated circuit component, an electric integrated circuit component and an insulating encapsulant is provided. The photonic integrated circuit component includes at least one optical input/output portion and at least one groove located in proximity of the at least one optical input/output portion. The electric integrated circuit component is disposed on and electrically connected to the photonic integrated circuit component. The insulating encapsulant is disposed on the photonic integrated circuit component and laterally encapsulates the electric integrated circuit component, wherein the at least one groove of the photonic integrated circuit component and the insulating encapsulant are adapted for insertion of a photonic device.

In accordance with some embodiments of the disclosure, a manufacturing method of an optical transceiver including the followings is provided. A photonic integrated circuit component is provided, wherein the photonic integrated circuit component includes at least one optical input/output portion and at least one groove located in proximity of the at least one optical input/output portion. An electric integrated circuit component is bonded with the photonic integrated circuit component. A protrusion is formed on the photonic integrated circuit component to cover the at least one groove. An insulating encapsulant is formed on the photonic integrated circuit component to laterally encapsulate the electric integrated circuit component and the protrusion. The protrusion is removed from the photonic integrated circuit component.

In accordance with some embodiments of the disclosure, a manufacturing method of an optical transceiver including the followings is provided. An interposer comprising a plurality of photonic integrated circuit components is provided, wherein each of photonic integrated circuit components includes at least one optical input/output portion and at least one groove located in proximity of the at least one optical input/output portion. A plurality of electric integrated circuit components are bonded with the interposer. A plurality of protrusions are formed on the interposer, wherein the protrusions fill the grooves of the interposer and protrudes from the interposer. An insulating encapsulant is formed on the interposer to form a structure, wherein the insulating encapsulant laterally encapsulates the electric integrated circuit components and the protrusions. The structure is singulated to form a plurality of singulated optical transceivers. The protrusions are removed from the singulated optical transceivers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical transceiver, comprising:
   a photonic integrated circuit component comprising at least one optical input/output portion, wherein the photonic integrated circuit component has at least one groove located in proximity of the at least one optical input/output portion;
   an electric integrated circuit component stacked over and electrically connected to the photonic integrated circuit component; and an insulating encapsulant disposed on the photonic integrated circuit component and laterally encapsulating the electric integrated circuit component, wherein the insulating encapsulant and the at least one groove of the photonic integrated circuit component are adapted for insertion of a photonic device.

2. The optical transceiver as claimed in claim 1, wherein the electric integrated circuit component is electrically connected to the photonic integrated circuit component through a plurality of micro-bumps.

3. The optical transceiver as claimed in claim 1, wherein a portion of the insulating encapsulant is located above a portion of the at least one optical input/output portion, the portion of the insulating encapsulant comprises a curved sidewall, and a top width of the portion of the insulating encapsulant is greater than a bottom width of the portion of the insulating encapsulant.

4. The optical transceiver as claimed in claim 1, wherein a portion of the insulating encapsulant is located above a portion of the at least one optical input/output portion, the portion of the insulating encapsulant comprises a curved sidewall, and a top width of the portion of the insulating encapsulant is smaller than a bottom width of the portion of the insulating encapsulant.

5. The optical transceiver as claimed in claim 1, wherein a portion of the insulating encapsulant is located above a portion of the at least one optical input/output portion, and a top width of the portion of the insulating encapsulant is substantially equal to a bottom width of the portion of the insulating encapsulant.

6. The optical transceiver as claimed in claim 1 further comprising:
a wiring substrate, wherein the photonic integrated circuit component is disposed on and electrically connected to the wiring substrate.

7. The optical transceiver as claimed in claim 6 further comprising:
a plurality of conductive bumps; and
an underfill disposed between the wiring substrate and the photonic integrated circuit component, wherein the photonic integrated circuit component is electrically connected to the wiring substrate through the conductive bumps, and the conductive bumps are encapsulated by the underfill.

8. The optical transceiver as claimed in claim 7, wherein a portion of the underfill is located under the at least one groove, the portion of the underfill comprises a curved sidewall, and a top of the portion of the underfill is greater than a bottom width of the portion of the underfill.

9. The optical transceiver as claimed in claim 7, wherein a portion of the underfill is located under the at least one groove, the portion of the underfill comprises a curved sidewall, and a top width of the portion of the underfill is smaller than a bottom width of the portion of the underfill.

10. The optical transceiver as claimed in claim 7, wherein a portion of the underfill is located under the at least one groove, and a top width of the portion of the underfill is substantially equal to a bottom width of the portion of the underfill.

11. A manufacturing method of an optical transceiver, comprising:
providing a photonic integrated circuit component, wherein the photonic integrated circuit component comprises at least one optical input/output portion, wherein the photonic integrated circuit component has at least one groove in proximity of the at least one optical input/output portion;

bonding an electric integrated circuit component with the photonic integrated circuit component such that the electric integrated circuit component is electrically connected to the photonic integrated circuit component;
forming a protrusion on the photonic integrated circuit component to cover the at least one groove;
forming an insulating encapsulant on the photonic integrated circuit component to laterally encapsulate the electric integrated circuit component and the protrusion; and
removing the protrusion from the photonic integrated circuit component.

12. The manufacturing method as claimed in claim 11, wherein forming the insulating encapsulant on the photonic integrated circuit component comprises:
forming an insulating material on the photonic integrated circuit component to cover the electric integrated circuit component and the protrusion;
performing a first grinding process to partially remove the insulating material to reveal the electric integrated circuit component; and
after performing the first grinding process, performing a second grinding process to partially remove the insulating material and reduce a thickness of the electric integrated circuit component to reveal the protrusion.

13. The manufacturing method as claimed in claim 12 further comprising:
after performing the first grinding process and before performing the second grinding process, forming a plurality of conductive bumps on the photonic integrated circuit component, wherein the electric integrated circuit component and the protrusion are formed on a first surface of the photonic integrated circuit component, the conductive bumps are formed on a second surface of the photonic integrated circuit component, and the first surface is opposite to second surface.

14. The manufacturing method as claimed in claim 13 further comprising:
electrically connecting the photonic integrated circuit component to a wiring substrate through the conductive bumps; and
forming an underfill between the wiring substrate and the photonic integrated circuit component to laterally encapsulate the conductive bumps.

15. The manufacturing method as claimed in claim 14 further comprising:
after electrically connecting the photonic integrated circuit component to the wiring substrate through the conductive bumps and before forming the underfill, forming a confining structure on the wiring substrate to confine a distribution of the underfill; and
after forming the underfill, removing the confining structure.

16. A manufacturing method of an optical transceiver, comprising:
providing an interposer comprising a plurality of photonic integrated circuit components, and each of photonic integrated circuit components comprising at least one optical input/output portion, wherein the photonic integrated circuit component has at least one groove located in proximity of the at least one optical input/output portion;
bonding a plurality of electric integrated circuit components with the interposer such that the electric integrated circuit components are electrically connected to the photonic integrated circuit components;

forming a plurality of protrusions on the interposer, and the protrusions filling the at least one groove of the interposer and protruding from the interposer;

forming an insulating encapsulant on the interposer to form a structure, wherein the insulating encapsulant laterally encapsulates the electric integrated circuit components and the protrusions;

singulating the structure to form a plurality of singulated optical transceivers; and removing the protrusions from the singulated optical transceivers.

17. The manufacturing method as claimed in claim 16, wherein forming the insulating encapsulant on the interposer comprises:

forming an insulating material on the interposer to cover the electric integrated circuit components and the protrusions;

performing a first grinding process to partially remove the insulating material to reveal the electric integrated circuit components; and after performing the first grinding process, performing a second grinding process to partially remove the insulating material and reduce a thickness of the electric integrated circuit components to reveal the protrusions.

18. The manufacturing method as claimed in claim 17 further comprising:

after performing the first grinding process and before performing the second grinding process, forming a plurality of conductive bumps on the interposer, wherein the electric integrated circuit components and the protrusions are formed on a first surface of the interposer, the conductive bumps are formed on a second surface of the interposer, and the first surface is opposite to second surface.

19. The manufacturing method as claimed in claim 18 further comprising:

electrically connecting at least one of the singulated optical transceivers to a wiring substrate through the conductive bumps; and forming an underfill between the wiring substrate and the at least one of the singulated optical transceivers to laterally encapsulate the conductive bumps.

20. The manufacturing method as claimed in claim 19 further comprising:

after electrically connecting at least one of the singulated optical transceivers to the wiring substrate through the conductive bumps and before forming the underfill, forming a confining structure on the wiring substrate to confine a distribution of the underfill; and after forming the underfill, removing the confining structure.

* * * * *